United States Patent
Farley et al.

(10) Patent No.: US 8,168,941 B2
(45) Date of Patent: May 1, 2012

(54) ION BEAM ANGLE CALIBRATION AND EMITTANCE MEASUREMENT SYSTEM FOR RIBBON BEAMS

(75) Inventors: Marvin Farley, Ipswich, MA (US); Donald Polner, Marblehead, MA (US); Geoffrey Ryding, Manchester, MA (US); Theodore Smick, Essex, MA (US); Takao Sakase, Rowley, MA (US); Ronald Horner, Auburndale, MA (US); Edward Eisner, Lexington, MA (US); Paul Eide, Stratham, NH (US); Brian Freer, Medford, MA (US); Mark Lambert, Ipswich, MA (US); Donovan Beckel, Wakefield, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 301 days.

(21) Appl. No.: 12/357,688

(22) Filed: Jan. 22, 2009

(65) Prior Publication Data
US 2010/0181470 A1   Jul. 22, 2010

(51) Int. Cl.
*H01J 3/00* (2006.01)
*G01N 27/62* (2006.01)
(52) U.S. Cl. ............... 250/252.1; 250/397; 250/492.21; 324/71.3
(58) Field of Classification Search ............... 250/252.1, 250/397; 324/71.3
See application file for complete search history.

(56) References Cited

U.S. PATENT DOCUMENTS

| | | | |
|---|---|---|---|
| 5,554,926 A * | 9/1996 | Elmer et al. | 324/71.3 |
| 6,763,316 B2 * | 7/2004 | Evans | 702/134 |
| 2004/0149926 A1 * | 8/2004 | Purser et al. | 250/397 |
| 2004/0262533 A1 * | 12/2004 | Krueger | 250/397 |
| 2006/0108536 A1 * | 5/2006 | Hwang et al. | 250/397 |
| 2008/0142726 A1 * | 6/2008 | Relleen et al. | 250/400 |
| 2008/0142727 A1 * | 6/2008 | Ryding et al. | 250/400 |
| 2009/0121122 A1 * | 5/2009 | Kellerman et al. | 250/252.1 |
| 2009/0314932 A1 * | 12/2009 | Benveniste | 250/252.1 |

* cited by examiner

*Primary Examiner* — Jack Berman
*Assistant Examiner* — David E Smith
(74) *Attorney, Agent, or Firm* — Eschweiler & Associates, LLC

(57) ABSTRACT

An ion beam angle calibration and emittance measurement system, comprising a plate comprising an elongated slit therein, wherein the elongated slit positioned at a rotation center of the plate and configured to allow a first beam portion to pass therethrough. A beam current detector located downstream of the plate, wherein the beam current detector comprises a slit therein configured to permit a second beam portion of the first beam portion to pass therethrough, wherein the beam current detector is configured to measure a first beam current associated with the first beam portion. A beam angle detector is located downstream of the beam current detector and configured to detect a second beam current associated with the second beam portion. The plate, the current beam detector and the beam angle detector are configured to collectively rotate about the rotation center of the plate.

16 Claims, 14 Drawing Sheets

ION BEAM ANGLE CALIBRATION AND EMITTANCE MEASUREMENT SYSTEM FOR RIBBON BEAMS

FIELD OF THE INVENTION

The present invention relates generally to ion implantation systems for implanting ions into a workpiece, and more specifically to an ion beam angle calibration and emittance measurement system for ion and ribbon beams.

BACKGROUND OF THE INVENTION

Beam angle control during ion beam implantation has emerged as one of the critical parameters possibly second only to dose control. Implantation that takes place through apertures in masks with high aspect ratios (i.e., depth vs. width) is sensitive to the angle of incidence of the ions impinging on the workpiece surface. It is important that the angular distribution of ions be as symmetrical as possible in order to produce uniform dose into all desired areas of the workpiece. Obtaining uniform angles of incidence dictate that the angular distribution of the ion beams be accurately measured and controlled. Additionally, it is desired that ion beam emittance in both the x and y directions be measured at the plane of the workpiece. Knowing the emittance of the ion beam at the plane of measurement allows one to predict the ion beam envelope at any point in the free drift region.

Ion beam intensity is a measure of the number of particles per unit time at a given location of the ion beam cross section. The ion beam emittance is a measure of the angular spread of the beam at that location.

It is desirable to know the ion beam intensity and ion beam emittance across the extent of the ion beam. If doping problems occur, the intensity and emittance profile of the beam can be used for diagnosing those problems. Additionally, this information is useful when tuning the ion beam to assure consistency between successive workpiece doping cycles.

It is desirable that ion beam profile information be readily available on an essentially "real time" basis so that technicians monitoring ion implanter performance can make adjustments based upon the ion beam profile. Rapid updating of beam profile information allows those adjustments to be made and the effect the adjustments have on the beam profile to be studied and re-evaluated.

Thus, it is desirable to provide a system for improved ion beam angle calibration and emittance measurement.

SUMMARY OF THE INVENTION

The present invention overcomes the limitations of the prior art by providing a system for significantly improving the ion beam angle calibration and emittance measurement system for ion beams.

In one embodiment of the present invention is an ion beam angle calibration and emittance measurement system. The system comprising a plate comprising an elongated slit therein, wherein the elongated slit positioned at a rotation center of the plate and configured to allow a first beam portion to pass therethrough. A beam current detector located downstream of the plate, wherein the beam current detector comprises a slit therein configured to permit a second beam portion of the first beam portion to pass therethrough, wherein the beam current detector is configured to measure a first beam current associated with the first beam portion. A beam angle detector is located downstream of the beam current detector and configured to detect a second beam current associated with the second beam portion wherein the plate, the current beam detector and the beam angle detector are configured to collectively rotate about the rotation center of the plate.

In another embodiment of the present invention is an ion beam angle calibration and emittance measurement system. The system comprises a beam current detecting system comprising a housing with a face comprising an elongated slit on the face having a long dimension greater than a selected workpiece diameter, the elongation slit is configured as a rotation center of the housing. An electrostatic suppressor is located downstream of the elongated slit, wherein a profile Faraday cup with a rear slit is located downstream of the electrostatic suppressor configured to measure beam profiles in a first direction and in a second direction that is orthogonal to the first direction. An angle Faraday cup is located downstream of the rear slit configured to obtain an angular distribution of the ion beam in the first direction and in the second direction. A first fraction of an ion beam is admitted into the profile Faraday cup after passing through a protection plate slit and the front elongation slit. A second fraction of an ion beam is admitted into the angle Faraday cup.

In yet another embodiment of the present invention a system for measuring and calibrating a workpiece surface plane with respect to an ion beam plane, comprising a sensor assembly with a sensor head plane. The sensor assembly comprises a housing with a face having an elongated slit with an electrostatic suppressor downstream of the slit. A profile Faraday cup upstream of the electrostatic suppressor is configured to measure beam profiles in the x and y axes. The profile Faraday cup has a rear slit which allows a portion of the ion beam to pass though the rear slit into the angle Faraday cup. The sensor head plane and the measurement plane are coincident and ion beam emittance is measured along the sensor head plane.

To the accomplishment of the foregoing and related ends, the invention comprises the features hereinafter described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
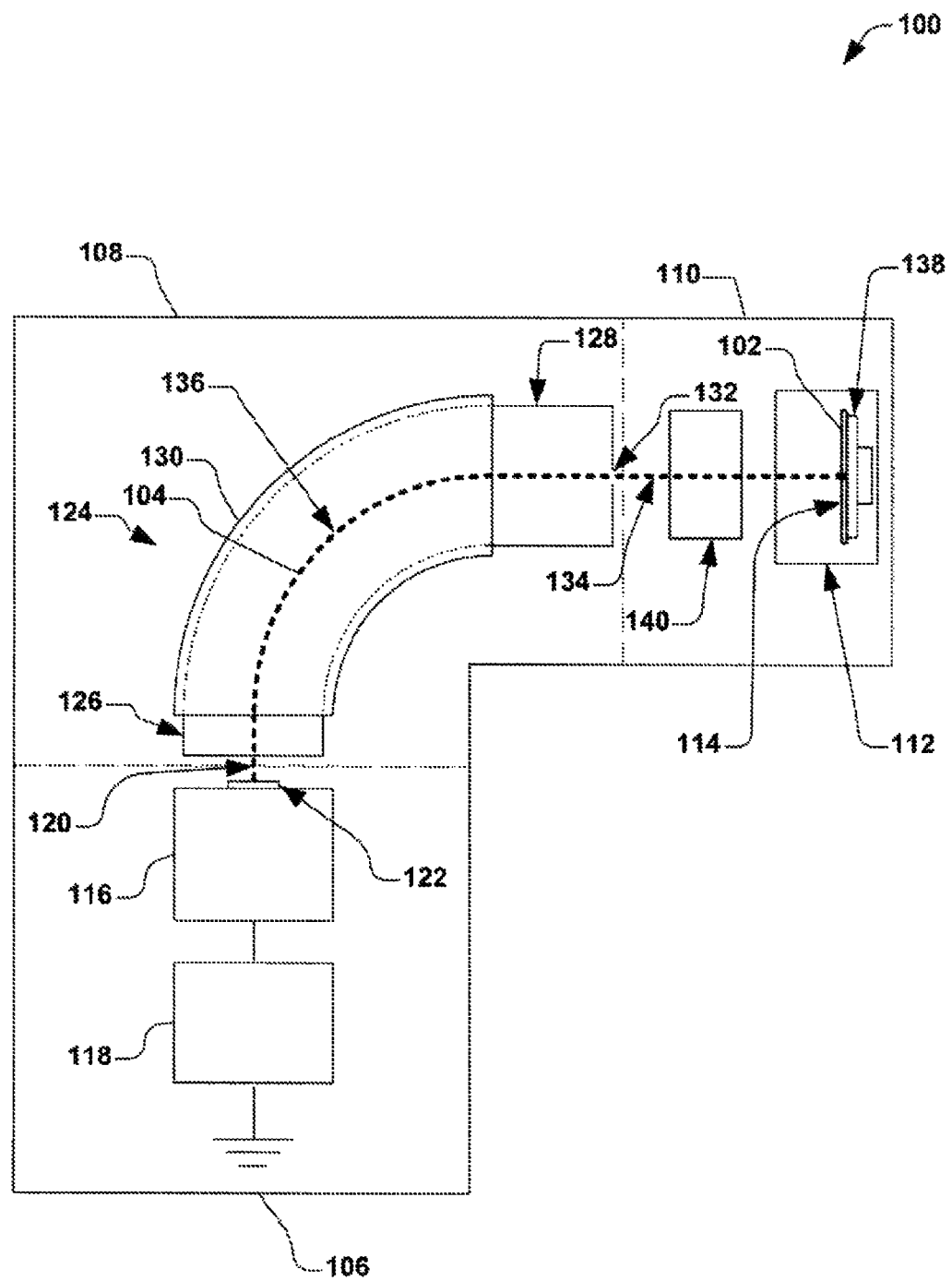
FIG. 1 illustrates an exemplary ion implantation system in accordance with at least one aspect of the present invention.

The present invention is directed generally toward improving ion beam angle calibration and emittance measurement systems for ion beams. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, in accordance with one exemplary aspect of the present invention, FIG. 1 illustrates an exemplary ion implantation system 100, wherein the ion implantation system is operable to scan a workpiece 102 (e.g., a semiconductor substrate or workpiece) relative to an ion beam 104, thereby implanting ions into the workpiece 102. As stated above, various aspects of the present invention may be implemented in association with any type of ion implantation apparatus, including, but not limited to, the exemplary system 100 of FIG. 1. The exemplary ion implantation system 100 comprises a terminal 106, a beamline assembly 108, and an end station 110 that generally forms/contains a process chamber 112, wherein the ion beam 104 is generally directed at the workpiece 102 positioned at a workpiece location 114. An ion source 116 in the terminal 106 is powered by a power supply 118 to provide an extracted ion beam 104 (e.g., an undifferentiated ion beam) to the beamline assembly 108, wherein the ion source 116 comprises one or more extraction electrodes 122 to extract ions from the source 116 and thereby to direct the extracted ion beam 104 toward the beamline assembly 108.

The beamline assembly 108, for example, comprises a beamguide 124 having an entrance 126 proximate to the source 116 and an exit 128 proximate to the end station 110. The beamguide 124, for example, comprises a mass analyzer 130 (e.g., a mass analysis magnet) that receives the extracted ion beam 104 and creates a dipole magnetic field to pass only ions of appropriate energy-to-mass ratio or range thereof through a resolving aperture 132 to the workpiece 102. The ions that pass through the mass analyzer 130 and exit the resolving aperture 132 generally define a mass analyzed or desired ion beam 134 having ions of the desired energy-to-mass ratio or range thereof. Various beam forming and shaping structures (not shown) associated with the beamline assembly 108 may be further provided to maintain and bound the ion beam 104 when the ion beam is transported along a desired beam path 136 to the workpiece 102.

In one example the desired ion beam 134 is directed to the workpiece 102, wherein the workpiece 102 is generally positioned via a workpiece scanning system 138 associated with the end station 110. The end station 110 illustrated in FIG. 1, for example, may comprise a "serial" type end station that provides a mechanical scanning of the workpiece within the evacuated process chamber 112, in which the workpiece 102 (e.g., a semiconductor workpiece, display panel, or other workpiece) is mechanically translated through the beam path 136 in one or more directions via a workpiece scanning system 138. According to one exemplary aspect of the present invention, the ion implantation system 100 provides the desired ion beam 134 (e.g., also referred to as a "spot beam" or "pencil beam") as being generally stationary, wherein the workpiece scanning system 138 generally translates the workpiece 102 in two generally orthogonal axes with respect to the stationary ion beam. A beam current detecting system 140 can be located between the resolving aperture 132 and the workpiece 102. It should be noted, however, that for example, ribbon beams and batch or other type end stations may alternatively be employed, and fall within the scope of the present invention. For example, the system 100 may comprise an electrostatic beam scanning system (not shown) operable to scan the ion beam 104 along one or more scan planes relative to the workpiece 102. Accordingly, the present invention contemplates any scanned or non-scanned ion beams 104 as falling within the scope of the present invention. According to one exemplary aspect of the invention, the ion implantation system 100 may comprise the ion implantation system and scanning apparatus described in commonly-owned U.S. Pat. No. 7,135,691 filed Apr. 5, 2005, the contents of which are hereby incorporated by reference. The ion implantation system 100 may also comprise other systems such as the Optima HD Scan System manufactured by Axcelis Technologies of Beverly, Mass.

Figure 2:
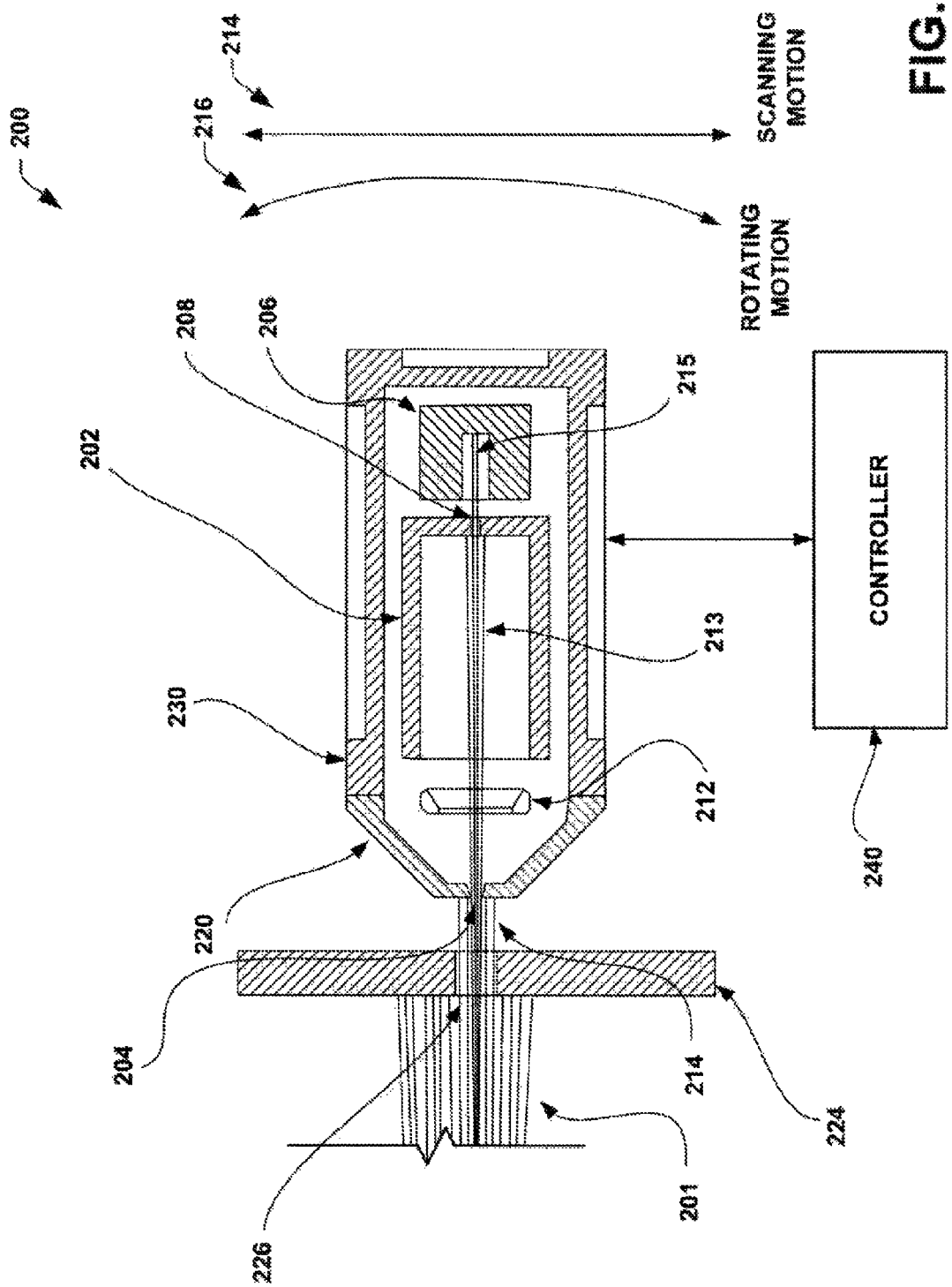
FIG. 2 illustrates a cross sectional view of an exemplary beam current detecting system with an elongated slit according to another aspect of the present invention.

Illustrated in FIG. 2 is a simplified cross sectional view of a beam current detecting system 200. The emittance profiler Faraday beam current detecting system 200 comprises a housing 230, a profile Faraday cup 202, a resolving slit 204, e.g., approximately 0.88 mm wide by 185 mm long, located in front of the profile Faraday cup 202 (e.g., Graphite). A protection shield 224 can be placed in front of an initial ion beam 201 in the beam current detecting system 200 with a shield resolving slit 226 to limit the ions of an ion beam 214 striking the housing face 220 of the beam current detecting system 200. A first beam portion 213 is admitted into the profile Faraday cup 202 which measures a first beam current. The beam 214 passes therethrough the slit 204 and a suppressor 212 to form a first ion beam portion 213. The profile Faraday cup 202 located downstream of the slit 204 and the profile Faraday cup 202 comprises a slit 208 therein that permits a second beam portion 215 of the first beam portion 213 to pass therethrough. The profile Faraday cup 202 is configured to measure a first beam current associated with the first beam portion 213. An angle Faraday cup 206 is located downstream of the profile Faraday cup 202 and configured to detect a second beam current associated with the second beam portion 215. The housing face 220, the profile Faraday cup 202 and the angle Faraday cup 206 are configured to collectively rotate about the rotation center of the housing face 220.

The electrostatic suppressor 212 prevents electrons from crossing the suppressor plane allowing only the energetic beam ions to pass through with which in turn results in an accurate measurement of the ion beam charge by the Faraday system 200 profile Faraday cup 202. The approximately 0.88 mm wide by 160 mm long rear resolving slit 208 is formed in the profile Faraday cup 202 and an angle Faraday cup 206 is located downstream of the profile Faraday cup 202. The sum of the current sampled by the profile Faraday cup 202 and the angle Faraday cup 206 divided by the 0.88 mm aperture width is the one dimensional dose rate dI/dx or dI/dy. In general the fraction of the total beam flux admitted through the housing slit 204 is much greater than the total beam flux admitted through the profile Faraday cup slit 208. The axial distance between the surface of the first resolving slit 204 and the rear slit 208 is 40 mm resulting in an angular uncertainty of 2×0.88/40 or 44 mrad or +/−1.26 degrees. This measure is the resolution of the collimating apertures but does not limit the differential resolution of the system while the Faraday system 200 is being swept through smaller angular increments. The resulting measurement is the convolution of the +/−1.26 degree window with the angular distribution function of the ion beam. Although there may be no necessity to deconvolute the measurement, there are well known techniques by those of skill in the art that may be applied to do so.

A controller 240 can be utilized to determine the ion beam emittance and angle as a function of the wobble angle, the first beam current and the second beam current for various locations in a plane or a 3D space. The controller 240 can be used to utilize these measurements to tune the ion beam. In other words, the ion beam profile information can be readily available on essentially a "real time" basis so that technicians monitoring the ion implanter performance can make adjustments based upon the ion beam profile. Rapid updating of beam profile information allows those adjustments to be made and the effect the adjustments have on the beam profile to be studied and re-evaluated.

It should be appreciated that one of skill in the art could fabricate the beam current detecting system 200 without the housing 230. In other words, the system 200 can comprise a plate with an elongated slit, wherein the elongated slit positioned at the rotation center of the plate. Both the profile and the angle Faraday cups can be replaced by any type of beam current detectors known by those of skill in the art. The plate, the current beam detector and the beam angle detector can be configured to collectively rotate about the rotation center of the plate.

The beam current detecting system may be used with systems such as the Optima HD Scan System manufactured by Axcelis Technologies, for example, the system pictorially shown in FIG. 1.

The beam current detecting system 200 illustrated in FIG. 2 can be mounted to a robotic arm system, a linear drive system, and the like, wherein, for example, a robotic arm (not shown) causes the beam current detecting system 200 to move in a rectilinear or scanning motion in a first direction (scanning motion) orthogonal to the slit 204. A rotating motion 216 can be done simultaneously with the scanning motion at a much faster rate to produce many angular scan passes per rectilinear scan pass. The first beam portion 213 is admitted into the profile Faraday cup 202, as illustrated. The second beam portion admitted into the angle Faraday cup 206 can be sampled at a 1000 samples per second simultaneously with motor positions producing a 4×10,000 sample array of beam intensity vs. motor position in a 10 second measurement period. The array contains angle Faraday cup readings vs. angle, and profile Faraday cup readings vs. scan position. It should be appreciated by one of skill in the art that various other sampling rates, measurement periods, dimensions, etc., can be utilized and not depart from the scope of the present invention, nor limit the invention in any way.

Figure 3:
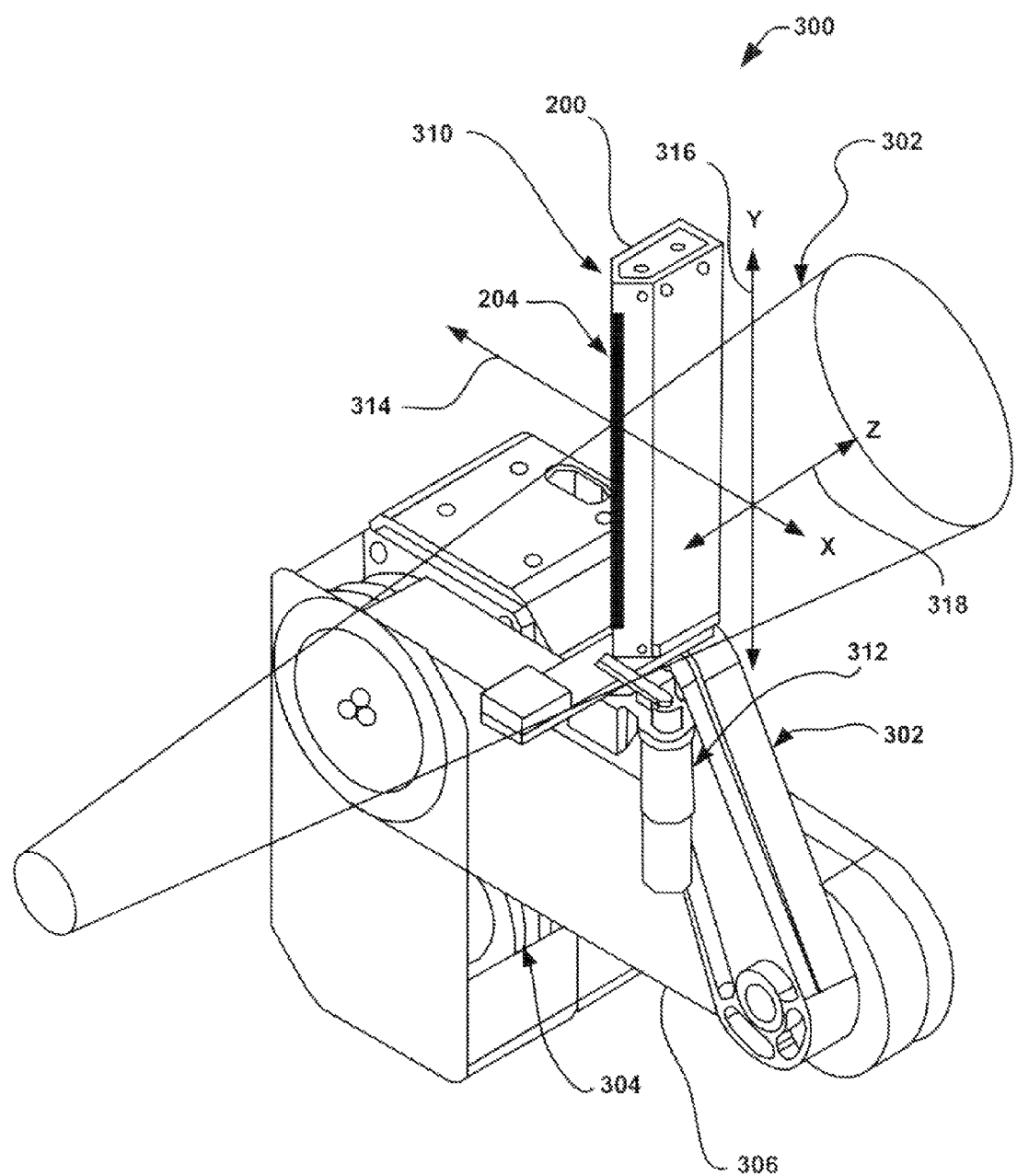
FIG. 3 illustrates a perspective view of an exemplary ion beam angle calibration and emittance measurement system in accordance with yet another exemplary aspect of the invention.
Figure 4:
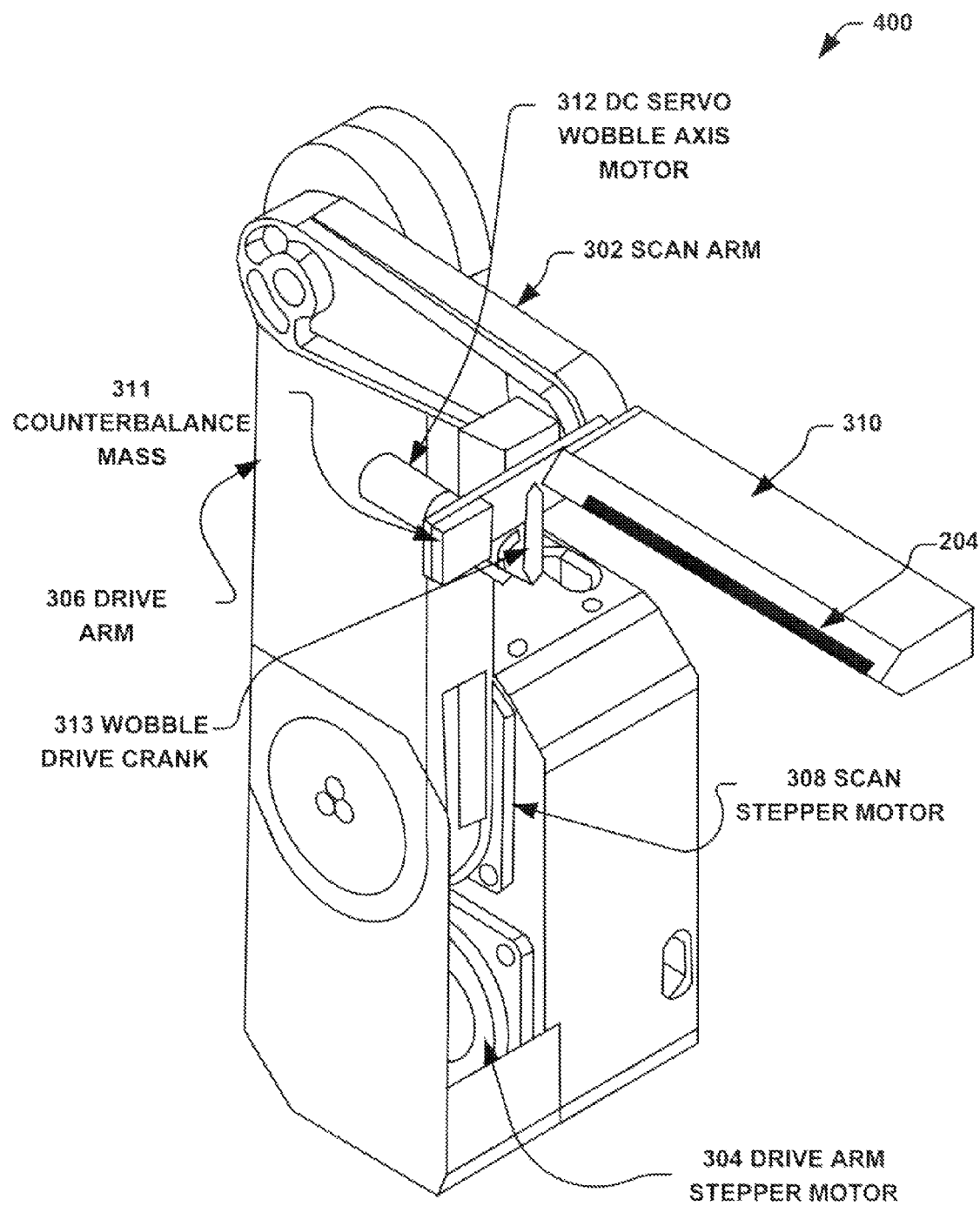
FIG. 4 illustrates yet another exemplary perspective view of an ion beam angle calibration and emittance measurement system in accordance with another aspect of the invention.
Figure 5:
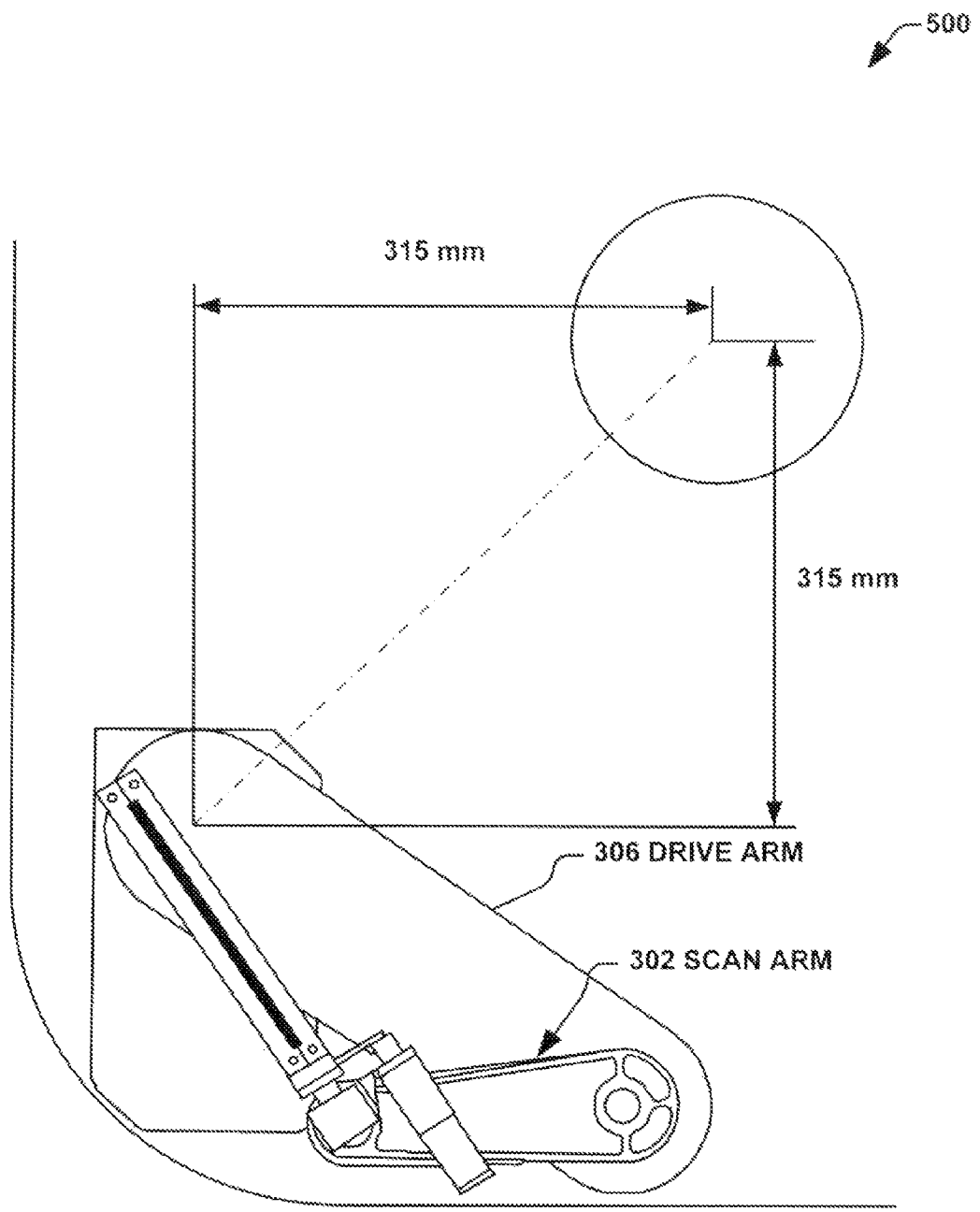
FIG. 5 illustrates another perspective view of an exemplary ion beam angle calibration and emittance measurement system in a stowed position according to another aspect of the present invention.
Figure 6:
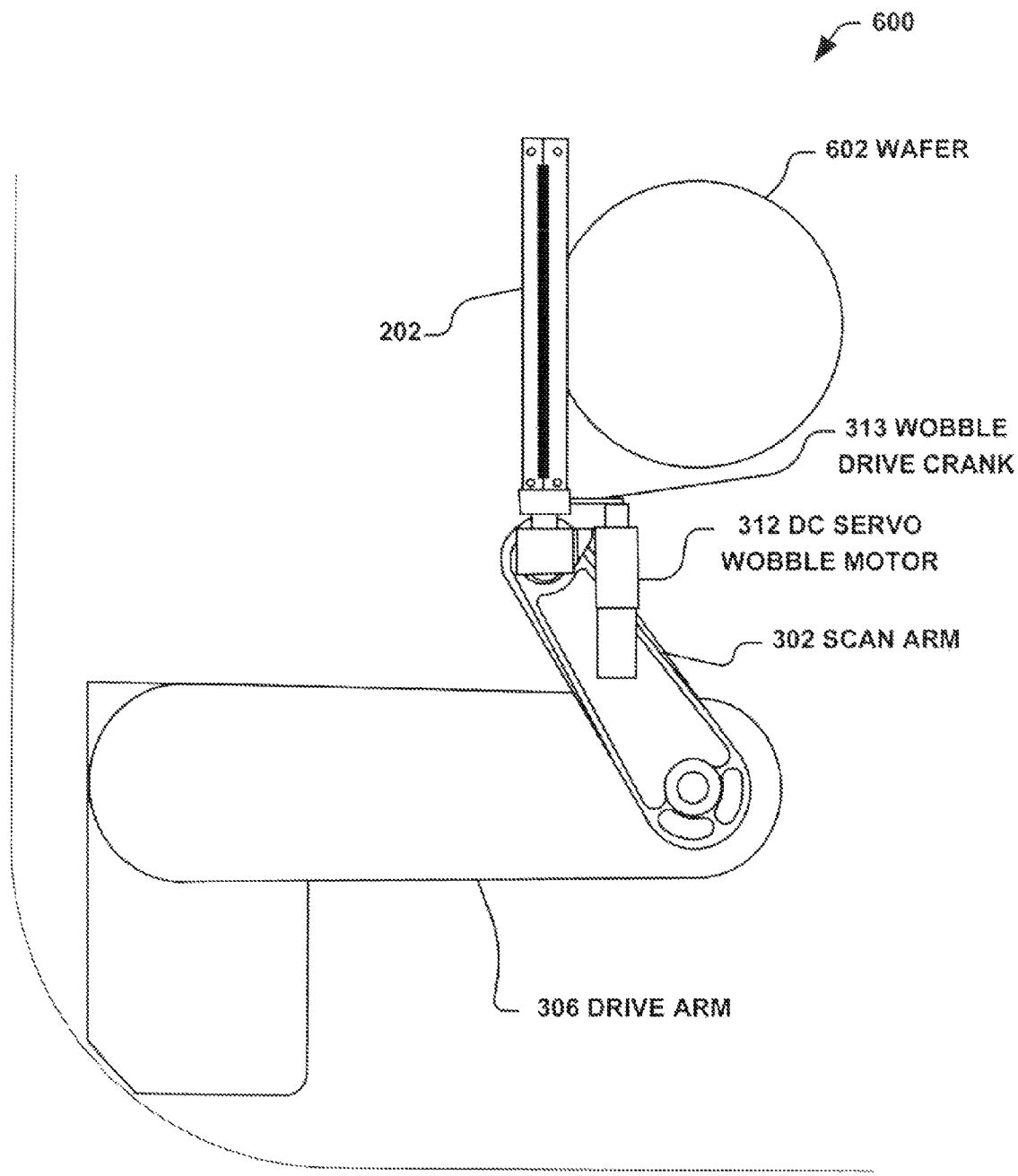
FIG. 6 is an exemplary ion beam angle calibration and emittance measurement system illustrated as a side view in accordance with another exemplary aspect of the invention.
Figure 10:
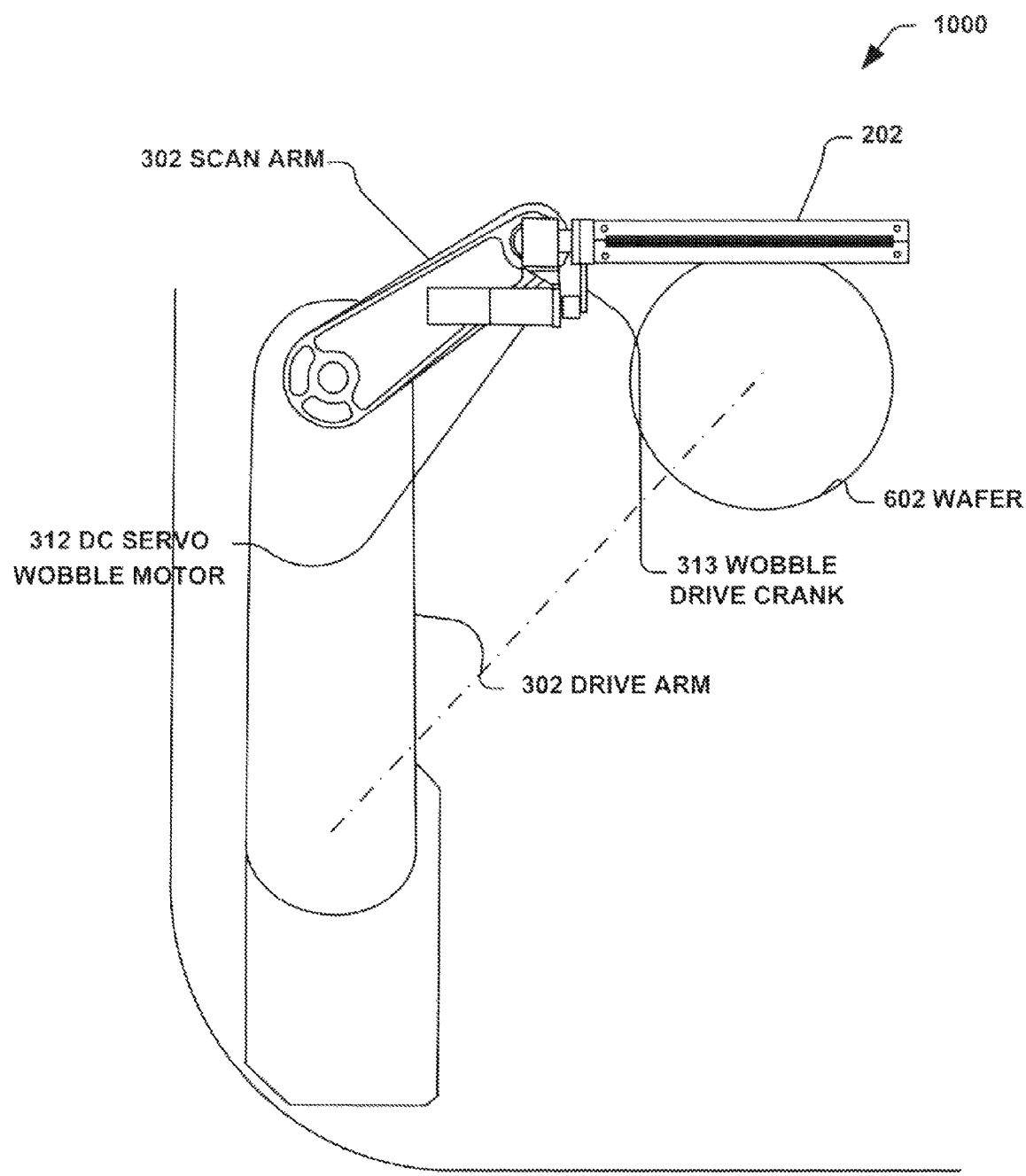
FIG. 10 illustrates a side view of an exemplary ion beam angle calibration and emittance measurement system according to another aspect of the present invention.

In one embodiment, the beam current detecting system 200 shown in FIG. 2 is attached to a robotic arm 302 of a robotic arm system 300 shown in FIGS. 3 and 4. The robotic arm system 300 is a special purpose robot that utilizes, for example, three motors to effect the motion of a slit 204 in both x and y directions. The drive arm stepper motor 304 shown in FIG. 3 moves the drive arm 306 between three positions, park position 500 (FIG. 5), x-scan ready position 600 (FIG. 6), and y-scan ready position 1000 (FIG. 10). The scan stepper motor 308 (FIG. 4) sweeps the beam current detecting system 200 across the ion beam 302 while a DC servo wobble axis motor 312 with a wobble drive crank 313 rotates the beam current detecting system 200 through plus and minus 12 degrees many times back and forth per sweep. The wobble axis of rotation is about the center of the housing slit 204. An optical encoder can be attached to each tilt axis 314, 316 and 318 (i.e., x, y and z) to accurately determine the position of the beam current detecting system 200. The beam current detecting system tilt stage can provide continuous scanning up to 3 Hz with an angular accuracy of 0.05 degrees or better.

Figure 7:
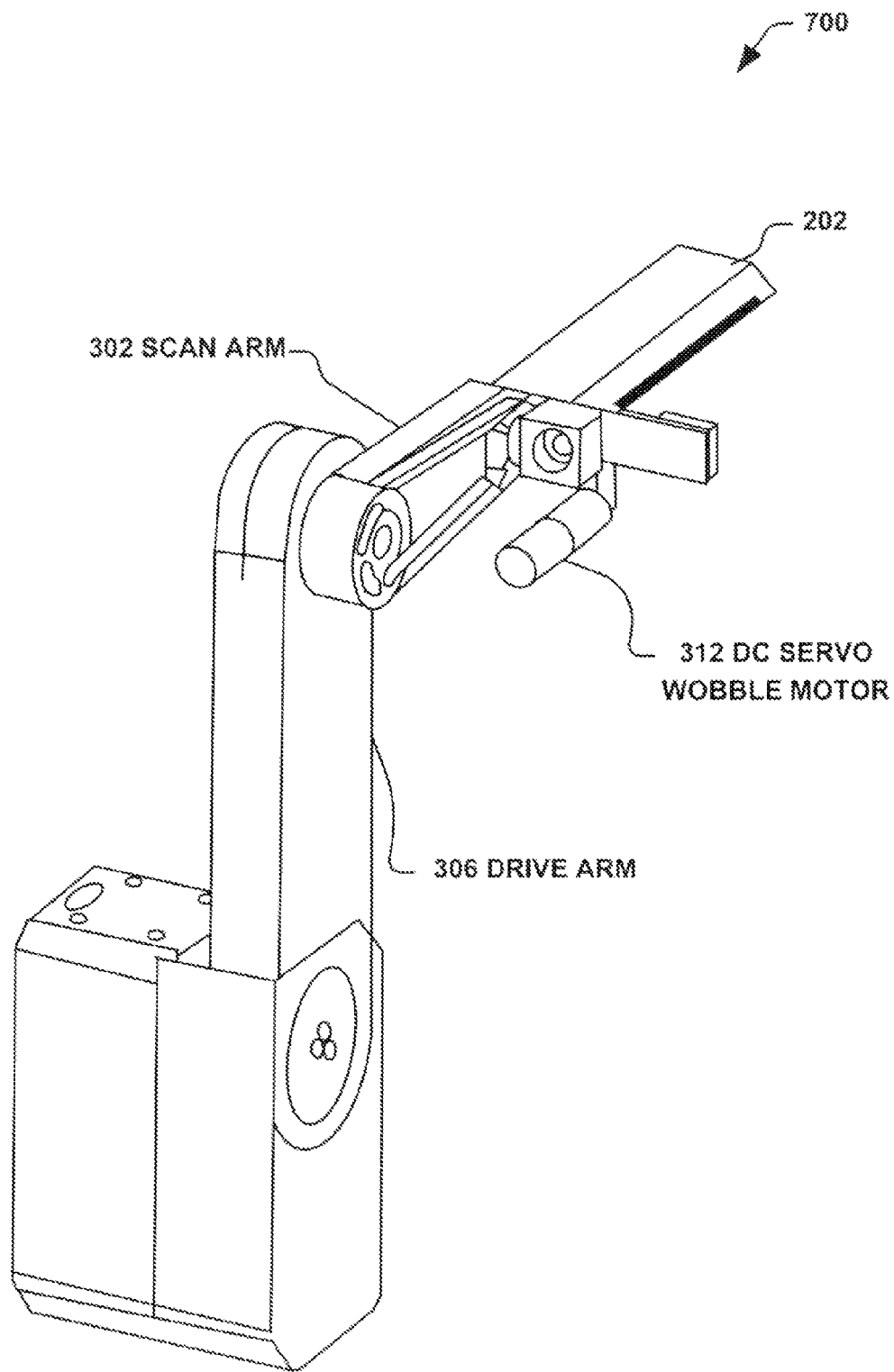
FIG. 7 illustrates a perspective view of an exemplary ion beam angle calibration and emittance measurement system in accordance with still another aspect of the invention.
Figure 8:
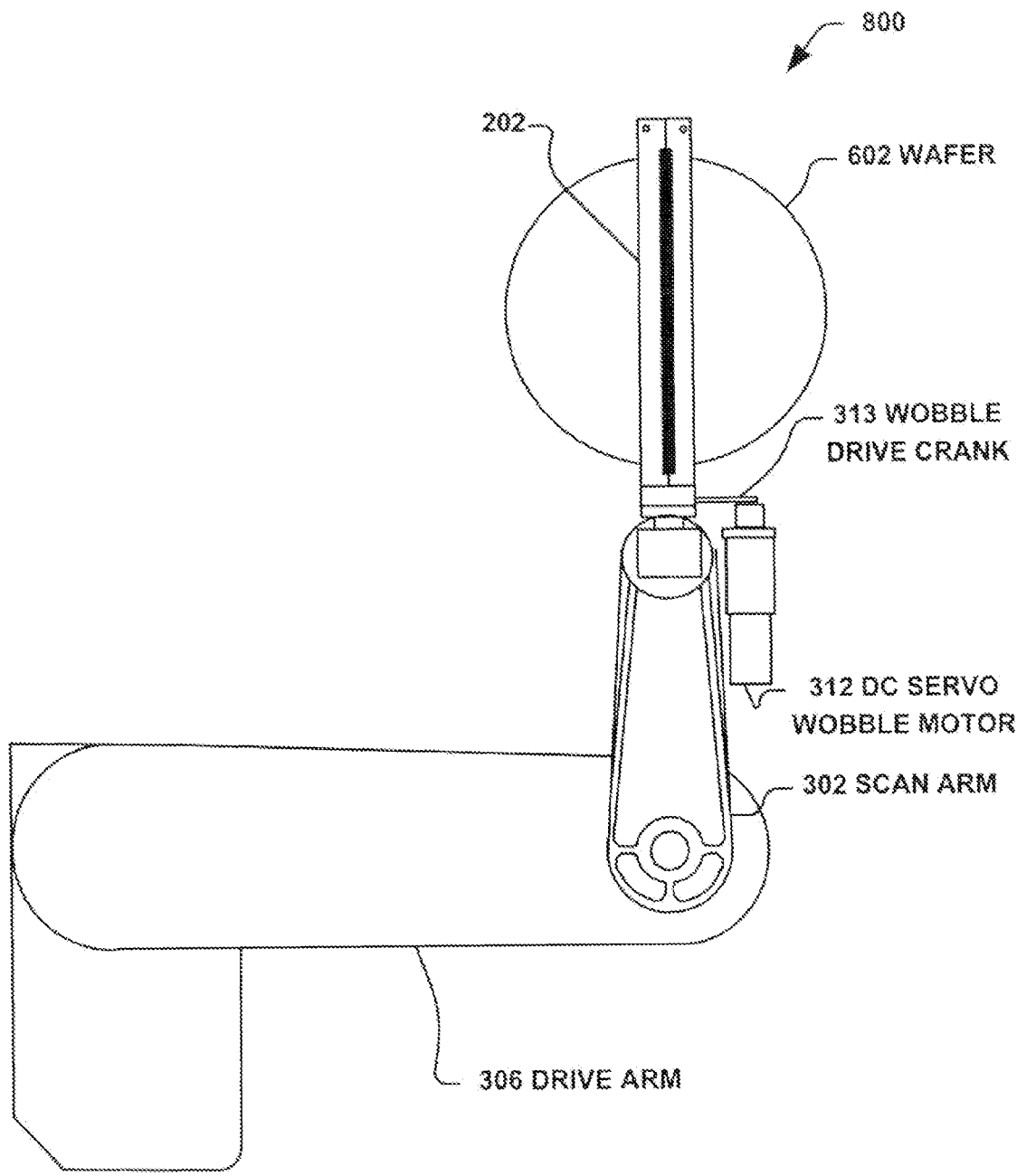
FIG. 8 illustrates another side view of an ion beam angle calibration and emittance measurement system in accordance with yet another exemplary aspect of the invention.
Figure 9:
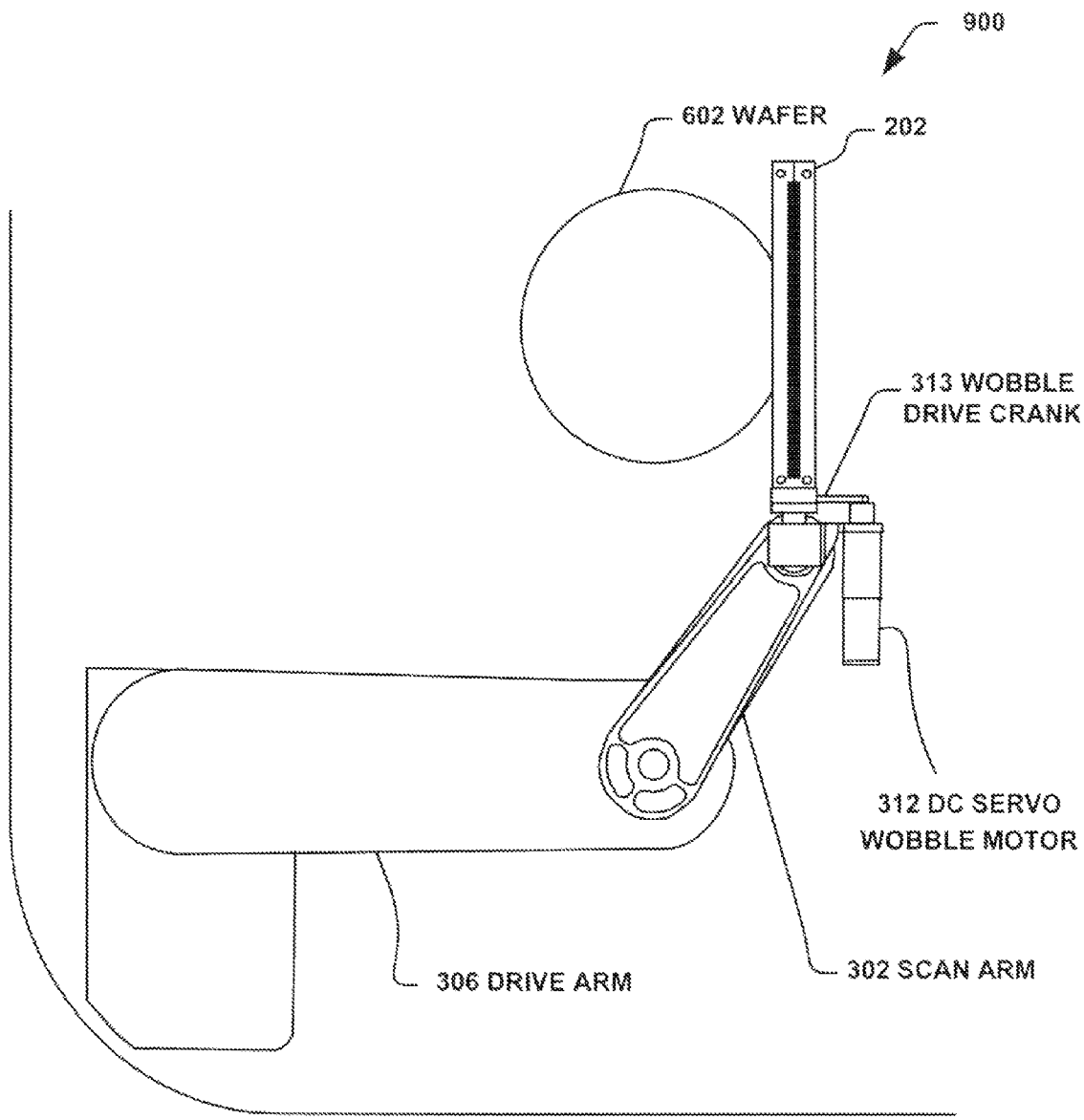
FIG. 9 illustrates yet another exemplary side view of an ion beam angle calibration and emittance measurement system in accordance with still another aspect of the invention.
Figure 11:
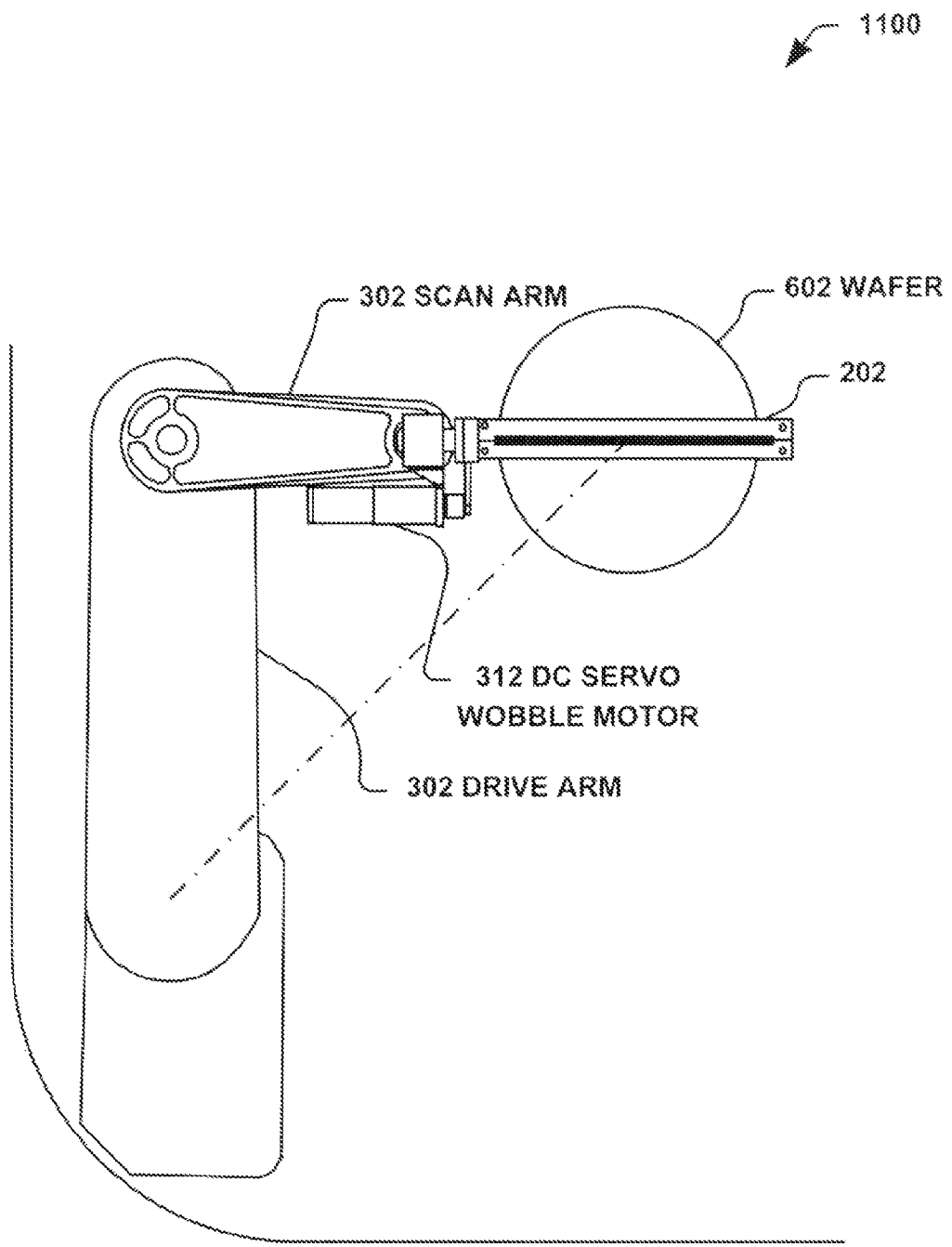
FIG. 11 is yet another side view of an exemplary ion beam angle calibration and emittance measurement system in accordance with yet another exemplary aspect of the invention.
Figure 12:
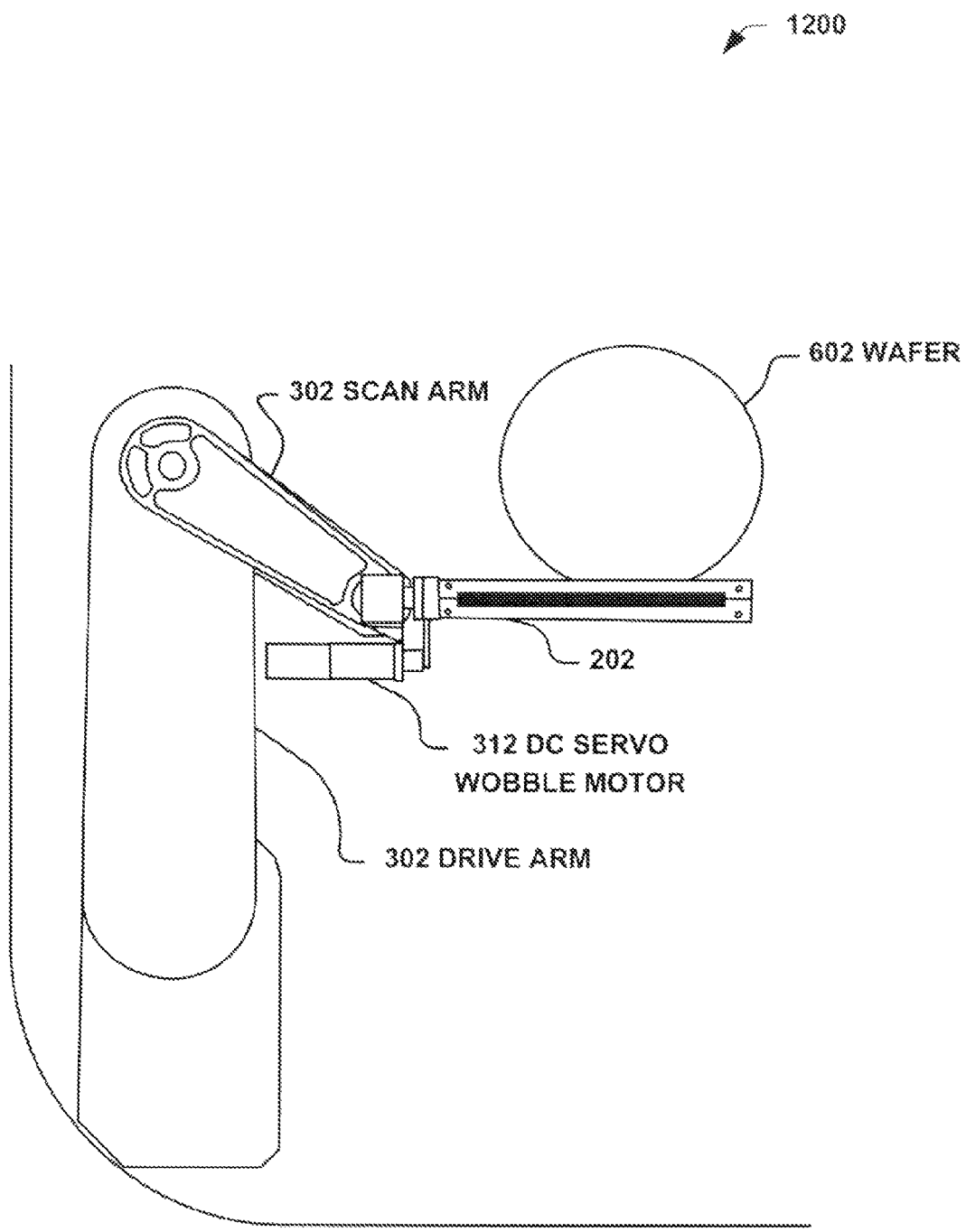
FIG. 12 illustrates another exemplary ion beam angle calibration and emittance measurement system illustrated as a side view in accordance with an aspect of the invention.
Figure 13:
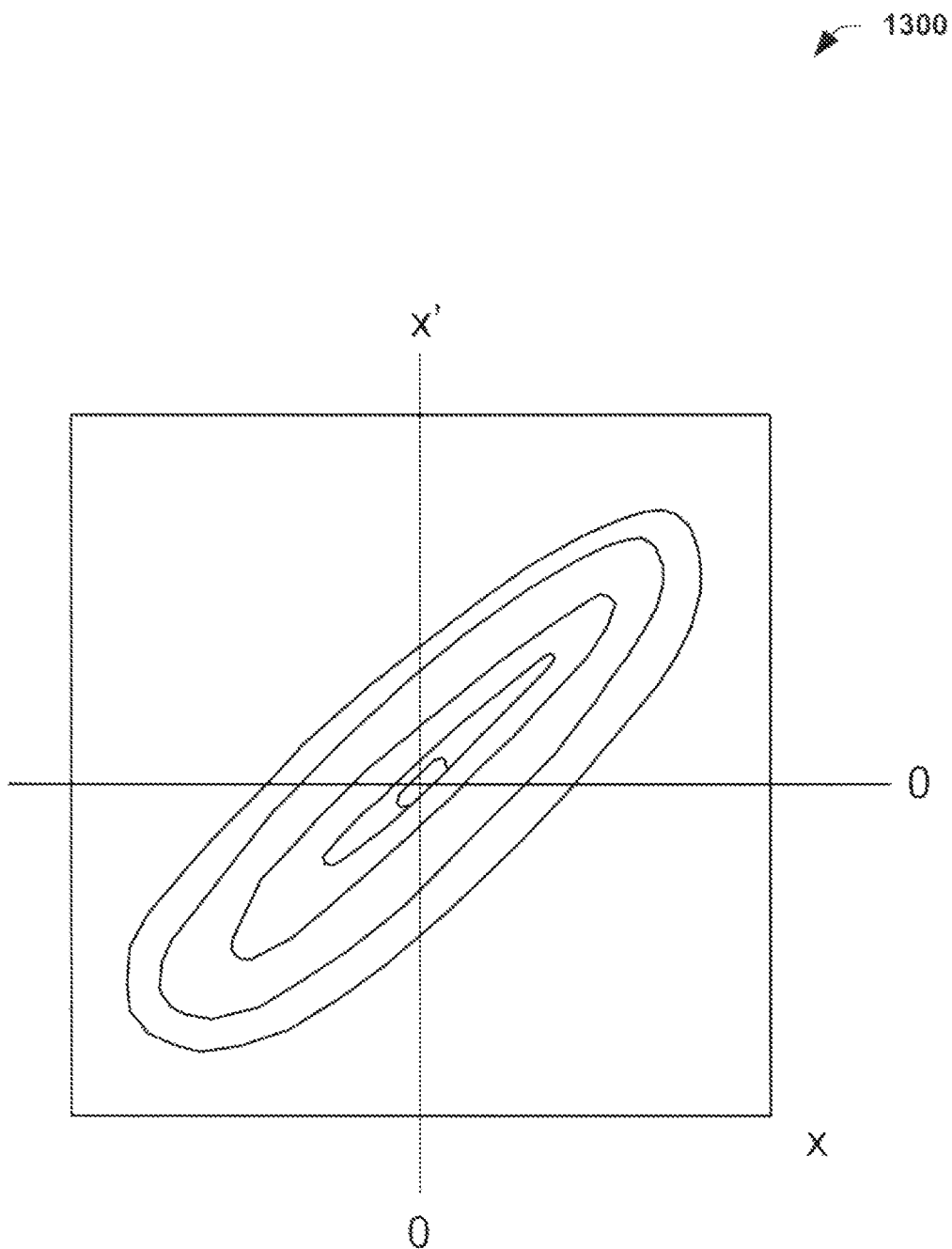
FIG. 13 is an illustration of a two dimensional plot of beam emittance.

It should be appreciated by one of skill in the art that the robotic arm system 300 that moves the beam current detecting system 200 can be any electromechanical system e.g., a linear actuated system, a belt/motor driven system, etc. The system can scan the beam current detecting system 200 in the horizontal or vertical direction at approximately 10 seconds per scan or faster. The system can park the robotic arm system 300 in less than one second to move the system 300 out of the way of the ion beam 302. FIGS. 7, 8 and 9 illustrate the robotic arm system 300 as the beam current detecting system 200 is swept in a scanning motion in a first direction (e.g., horizontally) fully left 600 of the 180 mm maximum beam diameter 602, for example, in the horizontal scan center position 800 continuously to the horizontal scan fully right position 900 of the beam diameter 602. FIGS. 10, 11 and 12 illustrate the robotic arm system 300 as the beam current detecting system 200 is swept in a scanning motion, for example, in a second direction, that is orthogonal to the first direction, (e.g., vertically) to a fully up position 1000, through the vertical scan center position 1100 of the workpiece diameter 602 continuously to the vertical scan fully down position 1200 of the beam diameter 602.

The x x' or y y' emittance is the two dimensional phase space diagram describing the ion beam intensity $I_{(x,x')}$ and $I_{(y,y')}$. When plotted in an x-y topographical format the x axis usually has units of millimeters or meters while the y axis has angular units of milliradians or radians. The intensity distribution is represented as contours of equal intensity, similar to the elevation contours in a topographical map. The choice of contour intervals may be defined as a 2-D histogram containing a fraction of the total beam or it may be a contour interval of intensity fraction. Technically it should be an interval enclosing a fraction of the total beam. The typical shape of an emittance plot is an ellipse. This is due to the nature of the plot as it represents an ensemble or collection of particles traveling together at roughly the same velocity (vz) having components of transverse velocity (vx, and vy) assigned to each particle. The tangents of the transverse angles are represented by the vertical axis of the emittance plot while their spatial locations x or y are represented by the horizontal axis.

Referring to FIG. 3 again, for example, the beam current detecting system 200 at the top of the drive arm 306 is swept in an arc through the ion beam 214 while the beam current detecting system 200 is rotated many times about the wobble axis 314 utilizing a DC servo wobble axis motor 312 producing simultaneous scans of both angle and position.

The beam current detecting system 200, illustrated in FIGS. 3-10 admits the portion of the ion beam 214 selected by the housing slit 204 and the angle Faraday cup slit 210 depending on the spatial and angular position of the beam current detecting system 200 and its given position and orientation as a function of time. While the beam current detecting system 200 is being moved, the beam current is sampled by the profile Faraday cup 202 and the angle Faraday cup 210 along with the angle and position of the Faraday assembly, for example. The sample rate is of the order of 1000 hertz enabling a large high resolution array of beam intensity vs position and angle. The resulting data array $D_{(i,j)}$ has i rows, and j, columns. For an x emittance scan $D_{(i,1)}$ is the x position column containing the center of the first resolving slit 204, $D_{(i,2)}$ is the column containing the angles of the plane of the slit 204, $D_{(i,3)}$ is the column containing the beam current samples made by the profile Faraday cup 202, and $D_{(i,4)}$ is the column containing the beam current samples made by the angle Faraday cup 210. The information contained in the data array D(i,j) is manipulated and presented as follows in order to fully realize the utility of this invention.

First, the plot of beam current dI/dx vs x is created by first calculating the numerical value of dI/dx for each data point and then plotting the resulting values against the corresponding x locations. If we assume the slot width of the first slit 204 is S then equation 1 below represents the value of dI/dx for each sample of beam current.

$$\left[\frac{dI}{dx}\right]_i = \frac{D_{i,3} + D_{i,4}}{S} \qquad \text{(Eq. 1)}$$

The x interval between samples is:

$$\Delta x_i = D_{i,2} - D_{i-1,2} \qquad \text{(Eq. 2)}$$

The total beam current approximated between samples is:

$$\Delta I_i = \Delta x_i \left[\frac{dI}{dx}\right]_i \qquad \text{(Eq. 3)}$$

The total current contained in the beam being measured is:

$$It = \sum_{i=0}^{n} \Delta I_i \qquad \text{(Eq. 4)}$$

Three of the data columns in the data array Di,j contain the information required for emittance measurement and plots. The columns $D_{i,1}$, $D_{i,2}$, and $D_{i,4}$ contain the x position, x' angle, and current samples from angle Faraday cup 210. A new array $D_{k,l}$ is generated with k corresponding to x position, l corresponding to x' angle, and the values from $D_{i,4}$. The beam emittance plot is done by producing a 2 dimensional contour plot of beam intensity vs x and x'. The current samples contained in the matrix $D_{k,l}$ are normalized using the total current from equation 4 as follows:

$$K = \frac{It}{\sum_{0}^{k}\sum_{0}^{l} D_{k,l}} \qquad \text{(Eq. 5)}$$

wherein K is a normalization factor used to normalize the sum of the angle Faraday cup plus the sampled current in the angle Faraday cup. The factor K is necessary to add dimensions to the values dI/dx' and dI/dy' and is well known by those of skill in the art.

The normalized current (Inorm) from the angle Faraday 210 samples is:

$$Inorm = K \sum_{0}^{k}\sum_{0}^{l} D_{k,l} \qquad \text{(Eq. 6)}$$

Figure 14:
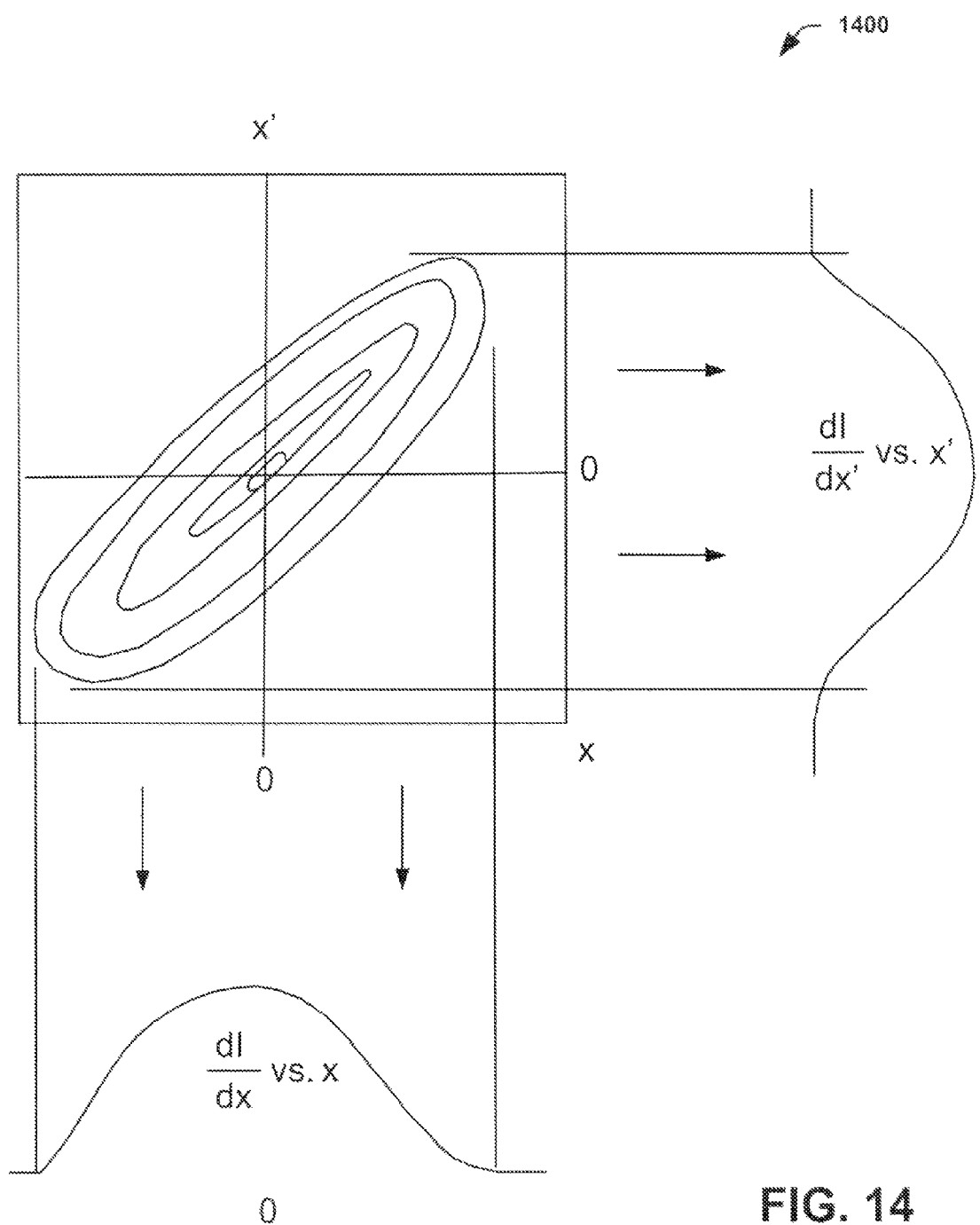
FIG. 14 is an illustration of projection of two one dimensional plots (dI/dx vs. x) and (dI/dx' vs. x') from the two dimensional plot of beam emittance.

The mapping of the one dimensional profiles 1400, (dI/dx vs x) and (dI/dx' vs x') is illustrated in FIG. 14 and two dimensional profiles 1500 in FIG. 15. The data summed across each row of $D_{k,l}$ is plotted against the x position corresponding to the row to produce the plot of (dI/dx vs x). The data summed across each column is plotted against the x' angle corresponding to the column to produce the plot of (dI/dx' vs x'). These types of profiles are well known by those of skill in the art.

It should be noted that although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An ion beam angle calibration and emittance measurement system, comprising:
   a plate comprising an elongated slit therein, wherein the elongated slit is positioned at a rotation center of the plate and configured to allow a first beam portion to pass therethrough along a beam axis;
   a beam current detector located downstream of the plate, wherein the beam current detector comprises a slit therein configured to permit a second beam portion of the first beam portion to pass therethrough, wherein the beam current detector is configured to measure a first beam current associated with the first beam portion;
   a beam angle detector located downstream of the beam current detector and configured to detect a second beam current associated with the second beam portion;

wherein the plate, the beam current detector and the beam angle detector are configured to collectively rotate about the rotation center of the plate in a direction non-parallel and not co-axial with the beam axis.

2. The ion beam angle calibration and emittance measurement system of claim 1, further comprising a controller configured to calculate an ion beam emittance and an ion beam angle as a function of a wobble angle, the first beam current and the second beam current at locations in a plane or a three dimensional space.

3. The ion beam angle calibration and emittance measurement system of claim 1, wherein the beam current detector and the beam angle detector are collectively enclosed in a housing with a front housing face with the elongated slit that comprises the plate, wherein a first end of the housing is attached to a first end of a rotatable scan arm.

4. The ion beam angle calibration and emittance measurement system of claim 3, further comprising an electrostatic suppressor located immediately downstream of the front housing face with the elongated slit, wherein the electrostatic suppressor is configured to prevent electrons from crossing a suppressor plane associated therewith.

5. The ion beam angle calibration and emittance measurement system of claim 1, affixed to a scan arm,
wherein the scan arm is configured to rotate about a scan arm axis;
wherein the scan arm is connected to a rotating robotic drive arm;
wherein the scan arm is configured to be driven about the scan arm axis by a scan stepper motor; and
wherein the robotic drive arm is configured to be driven by a drive arm stepper motor about a drive arm axis.

6. The ion beam angle calibration and emittance measurement system of claim 5,
wherein the rotatable scan arm and the rotatable drive arm together form a robotic arm assembly; and
wherein the robotic arm assembly is configured to move a housing containing the ion beam angle calibration and emittance measurement system in a rectilinear or scanning motion in a direction orthogonal to the slit.

7. The ion beam angle calibration and emittance measurement system of claim 6,
wherein an emittance profiler Faraday system rotating motion is performed concurrently with the rectilinear or scanning motion.

8. The ion beam angle calibration and emittance measurement system of claim 1, further comprising a DC servo wobble motor attached to a wobble drive crank;
wherein the wobble drive crank is attached to a housing containing the ion beam angle calibration and emittance measurement system and rotates a housing face thereof about the rotation center between minus 12 and plus 12 degrees.

9. The ion beam angle calibration and emittance measurement system of claim 1, wherein the combined measurements produce two 3-D profiles, $I(x,x')$ and $I(y,y')$ or four 2-D profiles $I(x)$, $I(x')$, $I(y)$ and $I(y')$, or both.

10. The ion beam angle calibration and emittance measurement system of claim 1, wherein a beam current for a data point is defined by:

$$\left[\frac{dI}{dx}\right]_i = \frac{D_{i,3} + D_{i,4}}{S}$$

wherein:
$[dI/dx]_i$=the beam current for the data point;
S=slot width in inches;
$D(i,j)$=a resulting data array that has i rows and j columns;

$D_{(i,3)}$ is the column containing the beam current samples made by the profile Faraday cup; and
$D_{(i,4)}$ is the column containing the beam current samples made by the angle Faraday cup.

11. The ion beam angle calibration and emittance measurement system of claim 1, wherein multiple measurements of first and second beam currents are taken at a plurality of locations varying from one another by an interval $\Delta x$, wherein the $\Delta x$ interval between samples:

$$\Delta x_i = D_{i,2} D_{i-1,2}$$

wherein:
$\Delta x_i$=the x interval between samples;
$D_{i,2}$=is a resulting data array that has i rows and 2 columns; and
$D_{i-1,2}$=is a resulting data array that has i−1 rows and 2 columns.

12. The ion beam angle calibration and emittance measurement system of claim 1, wherein multiple measurements of first and second beam currents are taken as samples at a plurality of locations varying from one another by an interval $\Delta x$, and wherein the total beam current approximated between samples is:

$$\Delta I_i = \Delta x_i \left[\frac{dI}{dx}\right]_i$$

wherein:
$\Delta I_i$=the total beam current approximated between samples;
$D_{i,2}$=is a resulting data array that has i rows and 2 columns; and
$D_{i-1,2}$=is a resulting data array that has i−1 rows and 2 columns.

13. The ion beam angle calibration and emittance measurement system of claim 1, wherein the total current contained in the beam being measured is:

$$It = \sum_{i=0}^{n} \Delta I_i$$

wherein:
$I_t$=is the total current contained in the beam being measured; and $$\sum_{i=0}^{n} \Delta I_i = \text{is the sum of the total beam}$$

current from $I_i$ row equals zero to i equals $n$.

is the sum of the total beam current from $I_i$ row equals zero to i equals n.

14. The ion beam angle calibration and emittance measurement system of claim 13, wherein the current samples contained in the matrix $D_{k,1}$ are normalized using the total current as follows:

$$K = \frac{It}{\sum_{0}^{k} \sum_{0}^{l} D_{k,l}}$$

wherein:
K=is a normalization factor used to normalize the sum of the angle Faraday cup plus the sampled current in the angle Faraday cup, the factor K is necessary to add dimensions to the values dI/dx' and dI/dy' and is well known by those of skill in the art; and $I_t$=is the total current contained in the beam being measured.

15. The ion beam angle calibration and emittance measurement system of claim 14, wherein the normalized current (Inorm) from the angle Faraday samples is:

$$Inorm = K \sum_{0}^{k} \sum_{0}^{l} D_{k,l}$$

wherein:

K=is a normalization factor used to normalize the sum of the angle Faraday cup plus the sampled current in the angle Faraday cup, the factor K is necessary to add dimensions to the values dI/dx' and dI/dy' and is well known by those of skill in the art; and $I_{norm}$=is the normalized current ($I_{norm}$) from the angle Faraday samples.

16. The ion beam angle calibration and emittance measurement system of claim 1, wherein the ion beam angle calibration and emittance measurement system can be moved entirely out of the path of the ion beam impacting the selected workpiece; and the system further comprises linear actuators, linear drives, and rack and pinion drives.

* * * * *